(12) United States Patent
Hatano et al.

(10) Patent No.: US 6,207,981 B1
(45) Date of Patent: Mar. 27, 2001

(54) CHARGE-COUPLED DEVICE WITH POTENTIAL BARRIER AND CHARGE STORAGE REGIONS

(75) Inventors: Keisuke Hatano; Yasutaka Nakashiba, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/187,844

(22) Filed: Nov. 6, 1998

(30) Foreign Application Priority Data

Nov. 21, 1997 (JP) .................................................... 9-320672

(51) Int. Cl.⁷ ................................................ H01L 29/768
(52) U.S. Cl. ............................................ 257/221; 257/248
(58) Field of Search ...................................... 257/217, 221, 257/246, 248

(56) References Cited

U.S. PATENT DOCUMENTS

| | | | |
|---|---|---|---|
| 3,796,932 | * 3/1974 | Amelio et al. | ...................... 257/221 |
| 4,064,524 | * 12/1977 | Hagiwara et al. | .................... 257/248 |
| 4,242,692 | * 12/1980 | Hagiwara | .............................. 257/248 |
| 4,821,081 | * 4/1989 | Hynecek | ............................... 257/217 |
| 4,992,842 | * 2/1991 | Yang et al. | ........................... 257/221 |
| 5,514,886 | * 5/1996 | Stevens et al. | ....................... 257/221 |

\* cited by examiner

Primary Examiner—Gene M. Munson
(74) Attorney, Agent, or Firm—Hayes, Soloway, Hennessey, Grossman & Hage, PC

(57) ABSTRACT

A two-phase, single-ply-electrode type charge-coupled device is provided that has a pair of a potential barrier region and a charge storage region underlying one charge transfer electrode. The charge storage region is formed in such a manner that the potential of the charge storage region becomes gradually deep in charge transfer direction. This structure enables smooth charge transfer.

10 Claims, 10 Drawing Sheets

← CHARGE TRANSFER DIRECTION

202 N TYPE SEMICONDUCTOR REGION

205 N⁻ TYPE SEMICONDUCTOR REGION

204 CONDUCTIVE ELECTRODE

205

302 N TYPE SEMICONDUCTOR REGION

305 N⁻ TYPE SEMICONDUCTOR REGION

304 CONDUCTIVE ELECTRODE

305

403 INSULATING FILM
402 N TYPE SEMICONDUCTOR REGION
401 P TYPE SEMICONDUCTOR SUBSTRATE

405 N⁺ TYPE SEMICONDUCTOR REGION

404 CONDUCTIVE ELECTRODE
405 N⁺ TYPE SEMICONDUCTOR REGION

409 METAL CONDUCTOR
408 INTERLAYERED INSULATING FILM

402 N TYPE SEMICONDUCTOR REGION

405 N⁺ TYPE SEMICONDUCTOR REGION

404 CONDUCTIVE ELECTRODE

405

704 FIRST CONDUCTIVE ELECTRODE

702 N TYPE SEMICONDUCTOR REGION

704 FIRST CONDUCTIVE ELECTRODE

705 N⁻ TYPE SEMICONDUCTOR REGION

707 SECOND CONDUCTIVE ELECTRODE

704

802 N TYPE SEMICONDUCTOR REGION

805 N⁻ TYPE SEMICONDUCTOR REGION

804 CONDUCTIVE ELECTRODE

805

US 6,207,981 B1

CHARGE-COUPLED DEVICE WITH POTENTIAL BARRIER AND CHARGE STORAGE REGIONS

BACKGROUND OF THE INVENTION

The present invention relates to a two-phase charge-coupled device with a single-layered electrode structure where a pair of potential barrier region and a charge storage region are disposed underneath one charge transfer electrode, and more particularly to a method for producing the charge-coupled device.

There are two types of charge-coupled devices: a 2-phase, 2-ply-electrode-type charge-coupled device and a 2-phase, single-ply electrode-type charge-coupled device.

The 2-phase, 2-ply electrode type charge-coupled device is disclosed in references: JP-A-192561/1992, JP-4133/1986, and IEDM Technical Digest, 1974, pp 55–58. This charge-coupled device is fabricated as follows:

Referring to FIGS. 12(A) to 12(E), an N-type semiconductor region 702 is first formed on a P-type semiconductor substrate 701. Then, a first insulating film 703 is formed on the surface of the N-type semiconductor region 702 though a heating process (FIG. 12(A)).

A first conductive electrode 704 of polycrystalline silicon is formed on the first insulating film 703 (FIG. 12(B)). As seen in FIG. 13, the first conductive electrode 704 has a rectangular top pattern. FIG. 13 is a schematic plan view corresponding to FIG. 12(B). The first conductive electrodes 704 are disposed at constant intervals.

Next, impurities (e.g. boron) of a conductivity type opposite to that of the N-type semiconductor region 702 are implanted into regions between the first conductive electrodes 704, so that a N$^-$-type semiconductor region 705 is formed (FIG. 12(C)). FIG. 14 is a schematic plan view corresponding to FIG. 12(C).

In succession, the first insulating film 703 is removed with the first conductive electrode 704 acting as a mask. Thereafter, the intermediate structure is again subjected to a heating process to form the second insulating film 706. A second conductive electrode 707 of polycrystalline silicon is formed on the second insulating film 706 corresponding to the first conductive electrode 704 and the N$^-$-type semiconductor region 705 (FIG. 12(D)). FIG. 15 is a schematic plan view corresponding to FIG. 12(D).

Next, an interlayered insulating film 708 is disposed. Electrodes are interconnected with metal conductors 709 (FIG. 12(E)). Thus, a conventional 2-phase, 2-ply electrode charge-coupled device is fabricated.

The progress of the micro patterning technique has allowed a single-ply electrode-type charge-coupled device with a electrode spacing of 0.2 to 0.3 μm to be fabricated by etching single-ply conductive electrode materials.

The charge-coupled device with the single-ply electrode structure has no electrode portions overlapped. This structure provides a small capacitance between layers and raises no insulation fault between electrodes. Moreover, the oxidizing process is not required to form the interlayered film. This allows metal films or silicide films to be used as an electrode material, instead of the polycrystalline silicon, so that the resistance component of the electrode can be decreased.

The 2-phase, single-ply electrode type charge-coupled device is fabricated according to the FIGS. 16(A) to 16(D).

An N-type semiconductor region 802 is first formed on a P-type semiconductor substrate 801. Then, the intermediate structure is subjected in a heating process to form an insulating film 803 on the surface of the N-type semiconductor region 802 (FIG. 16(A)).

Next, impurities (e.g. boron) of an opposite conductivity type to the second conductivity type of the N-type semiconductor region 802 are implanted with a photoresist in a predetermined pattern acting as a mask. Thus, the N$^-$-type semiconductor region 805 is formed (FIG. 16(B)). FIG. 17 is a schematic plan diagram corresponding to FIG. 16(B).

In succession, a conductive electrode 804 of a polycrystalline silicon is formed on the insulating film 803 (FIG. 16(C)). The conductive electrode 804 is patterned so as to have a pair of a charge storage region and a potential barrier region. FIG. 16(C) is a schematic plan diagram corresponding to FIG. 16(C).

Next, an interlayered film 808 is formed on the surface of the intermediate structure. Electrodes are interconnected with metal conductors 809 (FIG. 16(D)).

Thus, a conventional 2-phase drive type charge-coupled device with a single-ply electrode structure can be obtained.

On the other hand, in the 2-phase, 2-ply electrode type charge-coupled device, the potential barrier region is self-aligned with the charge transfer electrode and is formed in a rectangular pattern. In this structure, it has been difficult to provide a potential distribution sloped in the charge transfer direction to facilitate the charge transfer.

JP-A-192561/1994 discloses a solid-state image pickup device having slanted electrode patterns. However, even in this image pickup device, since the potential in the charge storage region becomes shallow gradually in a charge transfer direction, the advantages of the present invention cannot be obtained.

Moreover, the same problem arises in the above-mentioned single-ply electrode, 2-phase drive charge transfer device.

SUMMARY OF THE INVENTION

The objective of the present invention is to solve the above-mentioned tasks.

Moreover, the objective of the invention is to provide a charge-coupled device that can smoothly transfer electric charges.

Furthermore, the objective of the present invention is to provide a method for producing a charge-coupled device that can smoothly transfer electric charges.

The objective of the present invention is achieved by a charge-coupled device comprising a first conductivity-type semiconductor layer; a charge transfer electrode formed on the first conductivity-type semiconductor layer; and a potential barrier region and a charge storage region formed in the first conductivity-type semiconductor layer underneath the charge transfer electrode, wherein the charge storage region is formed in such a manner that the potential P(x) in the charge storage region at a point a distance x in the charge storage region apart in a charge transfer direction from the boundary between the potential barrier region and the charge storage region is a monotone decreasing function when a voltage is applied to the charge transfer electrode.

Moreover, according to the present invention, a charge-coupled device comprises a first conductivity-type semiconductor layer; a charge transfer electrode formed on the first conductivity-type semiconductor layer; and a potential barrier region and a charge storage region formed in the first conductivity-type region underneath the charge transfer electrode, wherein the charge storage region is formed in such a manner that the cross area of the charge storage region at a point a distance x in a charge transfer direction from the boundary between the potential barrier region and the charge storage region is a monotone increasing function when the charge storage region is cut perpendicularly to the charge transfer direction.

Particularly, in a charge-coupled device comprising a first conductivity-type semiconductor layer, a charge transfer electrode formed on the first conductivity-type semiconductor layer, and a potential barrier region and a charge storage region formed in the first conductivity-type semiconductor layer underneath the charge transfer electrode, the charge storage region is formed in such a manner that the potential P(x) in the charge storage region at a point a distance x in a charge transfer direction from the boundary between the potential barrier region and the charge storage region is a monotone decreasing function when a voltage is applied to the charge transfer electrode and in such a manner that the cross area of the charge storage region at a point a distance x in a charge transfer direction from the boundary between the potential barrier region and the charge storage region is a monotone increasing function when the charge storage region is cut perpendicularly to the charge transfer direction.

That is, the potential in the charge storage region is distributed so as to become deep gradually in the charge transfer direction so that smooth charge transfer can be accomplished. Hence, the above-mentioned structure can be achieved the above mentioned objects (smooth charge transfer operation).

Particularly, according to the present invention, the first conductivity-type semiconductor layer is formed on the surface of the semiconductor substrate of an opposite conductivity type of that of the first conductivity type semiconductor device.

The potential barrier region is formed by implanting impurities of a conductivity type opposite to that of the first conductivity type semiconductor layer. Alternatively, the charge storage region is formed by implanting impurities of the same conductivity type as that of the first conductivity type semiconductor layer. Now, the method is mainly employed where a potential barrier region is formed by implanting impurities of an opposite conductivity type. However, the method of forming the charge storage region by implanting impurities of the same conductivity type has the following advantages. For example, when the charge-coupled device is applied to the horizontal CCD for an image sensor, the charge storage region with deep potential distribution strengthens the transfer electric field between the vertical CCD and the horizontal CCD, thus realizing better charge transfer operation.

In the concrete configuration of the charge-coupled device, the charge storage region (or potential barrier region) is formed in a such way that the boundary surface between the potential barrier region and the charge storage region has a sloped surface, not a vertical surface, in the charge transfer direction.

In further detail description, the boundary between the potential barrier region and the charge storage region has a V-shaped surface.

The boundary between the potential barrier region and the charge storage region may have a W-shaped surface.

Moreover, the boundary between the potential barrier region and the charge storage region has a slash surface.

In the above-mentioned structure, the potential in the potential barrier region gradually becomes shallow in the charge transfer direction gradually because of the narrow channel effect (or the potential in the charge storage region becomes deep gradually in the transfer direction).

According to the present invention, a charge-coupled device fabricating method comprises the first step of forming an insulating film on a surface of the first conductivity-type semiconductor layer; the second step of implanting impurities of a second conductivity-type into the first conductivity-type semiconductor layer and then forming the potential barrier region in such a manner that the cross area of the charge storage region at a point at a distance x in a charge transfer direction from the boundary between the potential barrier region and the charge storage region is a monotone increasing function when the charge storage region is cut perpendicularly to the charge transfer direction; the third step of coating a conductive electrode material film on a surface of the insulating film to form the charge transfer electrode; and the fourth step of connecting the charge transfer electrode with a metal conductor via an interlayered insulating film.

Furthermore, according to the present invention, a charge-coupled device fabricating method comprises the first step of forming an insulating film on a surface of the first conductivity-type semiconductor layer; the second step of implanting impurities of a first conductivity-type into the first conductivity-type semiconductor layer and then forming the charge storage region in such a manner that the cross area of the charge storage region at a point at a distance x in a charge transfer direction from the boundary between the potential barrier region and the charge storage region is a monotone increasing function when the charge storage region is cut perpendicularly to the charge transfer direction; the third step of coating a conductive electrode material film on a surface of the insulating film to form the charge transfer electrode; and the fourth step of connecting the charge transfer electrode with a metal conductor via an interlayered insulating film.

In further specific description, a V-shaped, W-shaped, slash, or backslash boundary surface between the potential barrier region and the charge storage region is used as a mask when the impurities of a second conductivity type (or impurities of a first conductivity type) are implanted.

BRIEF DESCRIPTION OF THE DRAWINGS

This and other objects, features and advantages of the present invention will become more apparent upon a reading of the following detailed description and drawings, in which.

DESCRIPTION OF THE EMBODIMENTS

First Embodiment

The charge-coupled device according to the present invention will be described with reference to the attached drawings.

FIGS. 1(A), 1(B), 1(C) and 1(D) are flowcharts of the method of producing a charge-coupled device according to the present invention, more particularly, a charge-coupled device with a buried channel, single phase drive, single-ply electrode structure.

Figure 1A:
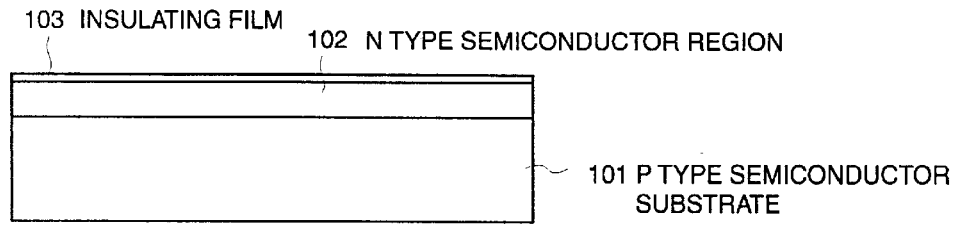
FIGS. 1(A), 1(B), 1(C), and 1(D) are cross sectional views illustrating a charge-coupled device producing method according to the first embodiment of the present invention.
Figure 1B:
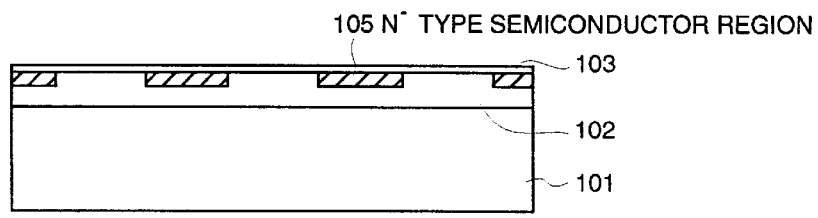
Figure 2:
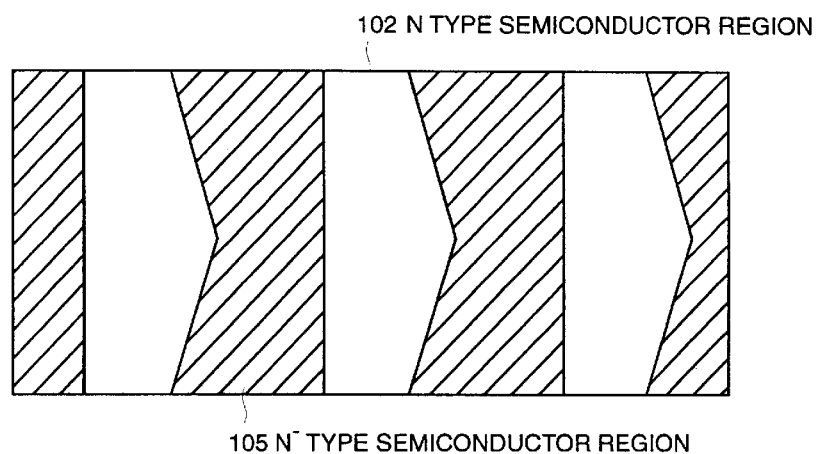
FIG. 2 is a schematic plan view corresponding to the intermediate structure of the FIG. 1(B)

FIG. 2 is a schematic plan view corresponding to FIG. 1(B).

Figure 1C:
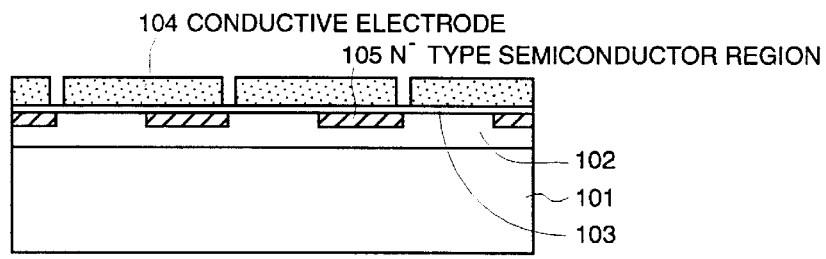
Figure 1D:
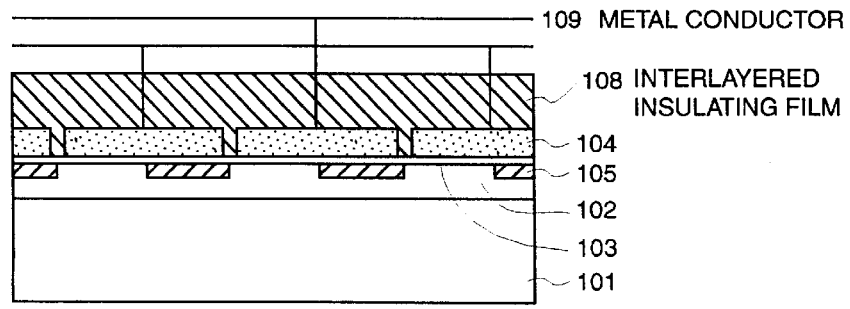
Figure 3:
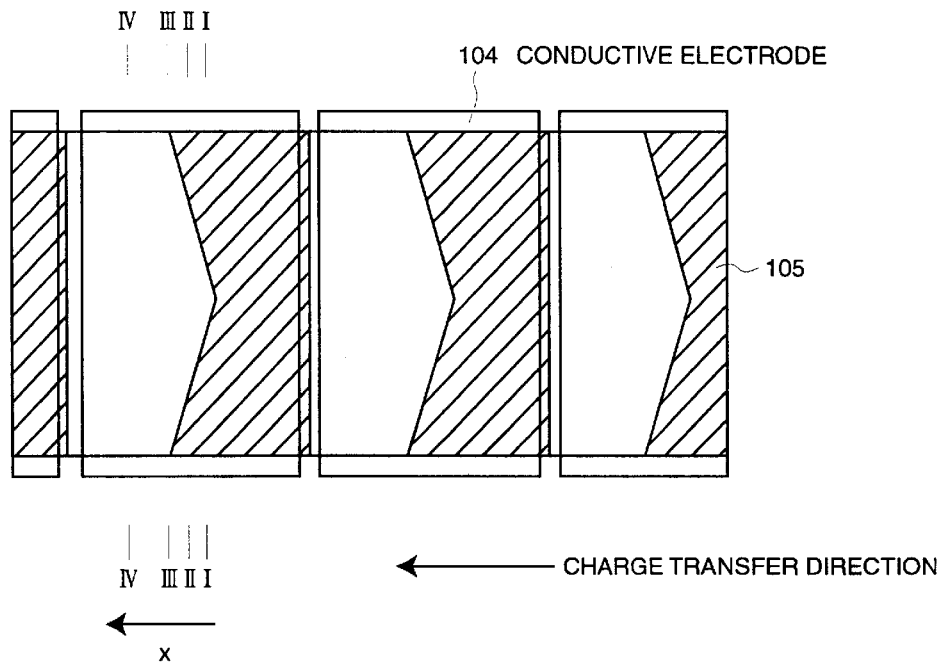
FIG. 3 is a schematic plan view corresponding to the intermediate structure of the FIG. 1(C)

FIG. 3 is a schematic plan view corresponding to FIG. 1(C).

Figure 4:
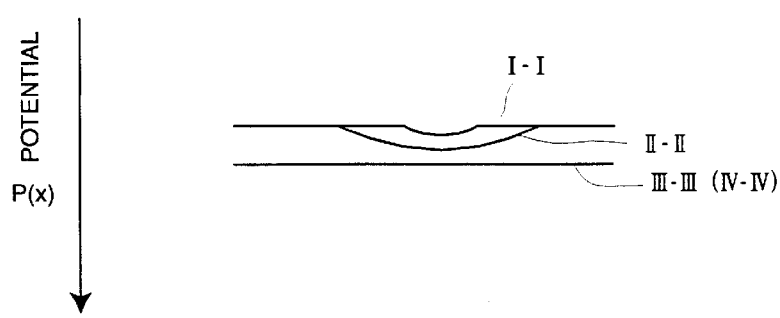
FIG. 4 is a graph plotting potentials P(x) along the line I—I, line II—II, the line III—III and the line IV—IV in a charge storage region of FIG. 3.

FIG. 4 is a graph plotting potentials (X) along the line I—I, the line II—II, and the line III—III, and the line IV—IV in the charge-coupled device shown in FIG. 3.

First, an N-type semiconductor region 102 of a conductivity type opposite to that of a P-type semiconductor substrate 101 is formed on the P-type semiconductor substrate 101. Then, the intermediate structure is subjected to an oxidizing process to form an insulating film (oxide film) 103 on the surface of the N-type semiconductor region 102 (FIG. 1(A)).

Next, impurities (e.g. boron) of a conductivity type opposite to that of the N-type semiconductor region 102 are ion-implanted, with a photoresist in a predetermined pattern acting as a mask, so that N$^-$-type semiconductor regions 105 are formed (FIG. 1(B)). In this case, the mask for the ion implantation differs from the conventional mask in its mask pattern. The mask has, for example, a pentagonal pattern (or a substantially D-shaped pattern, corresponding to the non-shaded portion in FIG. 2). In other words, the impurity implanted portion (corresponding to the shaded-portion in FIG. 2) has its narrowed middle portion and the widened end portions. That is, the N$^-$-type semiconductor regions 105 are formed so as to have a V-shaped boundary surface (plane) between the potential barrier region and the charge storage region. Where the middle portion of the impurity implanted region is narrowed in the charge transfer direction, the potential of the potential barrier region is gradually shallowed due to the narrow channel effect. That is, when a voltage is applied to the charge transfer electrode, the potential P(x) at the point a distance x in the charge transfer direction (shown with the arrow in FIG. 3) from the boundary between the potential barrier region and the charge storage region is expressed by a monotone decreasing function. The monotone decreasing function is expressed as $d(P(x))/dx<0$ but may be expressed as $d(P(x))/dx=0$. In the present embodiment, $P(x1)=P(x2)$ is held on the left side from the line III—III. P(x) is held as a decreasing function up to the line III—III.

In succession, conductive electrodes 104 of polycrystalline silicon are formed on the insulating film 103 (FIG. 1(C)). The conductive electrode 104 is patterned so as to overlie a pair of the charge storage region and the potential barrier region. FIG. 3 is a schematic diagram corresponding to FIG. 1(C).

Next, an interlayered insulating film 108 is formed on the intermediate structure. Electrodes are interconnected with the metal conductors 109 (FIG. 1(D)).

Thus, a 2-phase drive type charge-coupled device with a single-ply electrode structure according to the present invention can be fabricated.

In the present embodiment, the potential barrier region (charge storage region) is formed in such a way that the potential of the potential barrier region is gradually shallowed in the charge transfer direction (or the potential in the charge storage region is gradually deepened in the charge transfer direction). That is, the sloped or slanted potential distribution increases the charge transfer rate, thus enabling smooth charge transfer.

Second Embodiment

Figure 5:
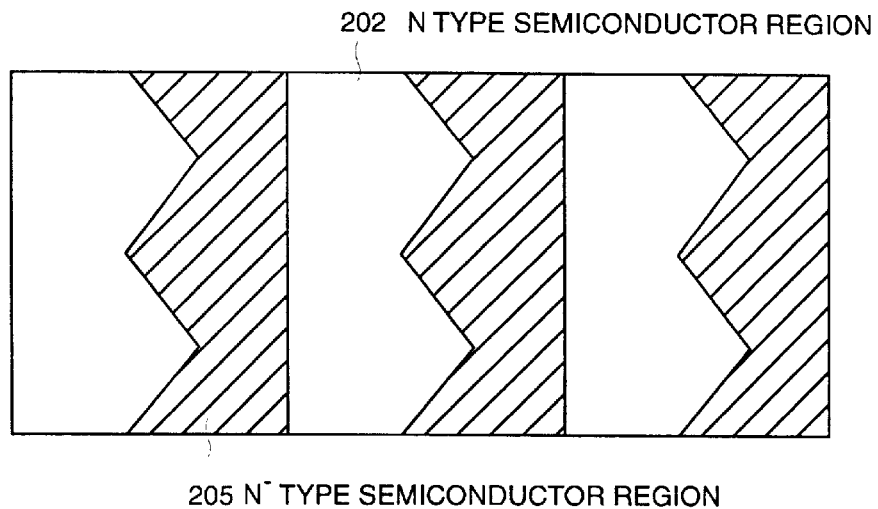
FIG. 5 is a schematic plan view of the intermediate structure in a step of the charge-coupled device producing method according to the second embodiment of the present invention.
Figure 6:
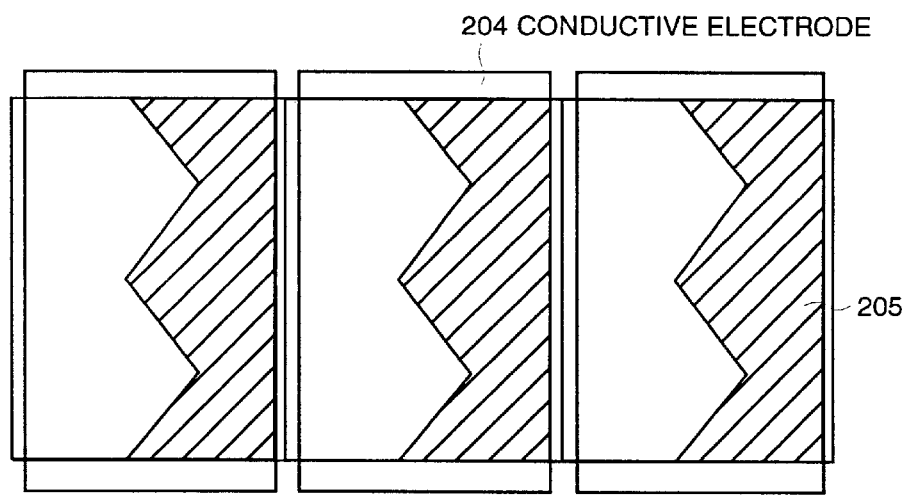
FIG. 6 is a schematic plan view of the intermediate structure in a step of the charge-coupled device producing method according to the second embodiment of the present invention.

FIGS. 5 and 6 are schematic plan views each illustrating a charge-coupled device according to the second embodiment of the present invention. FIG. 5 is a diagram corresponding to the first embodiment of FIG. 2. FIG. 6 is a diagram corresponding to the first embodiment of FIG. 3.

In the present embodiment, as understood by comparing FIG. 2 with FIG. 6 and FIG. 3 with FIG. 6, the N$^-$-type semiconductor region 205 is formed in such way that the boundary surface or plane between the potential barrier region and the charge storage region has a W-shaped pattern. Other details are the same as those in the first embodiment. Hence, the detailed description will be omitted here. Numeral 202 in FIG. 5 represents an N-type semiconductor region while numeral 204 in FIG. 6 represents a charge transfer electrode.

Third Embodiment

Figure 7:
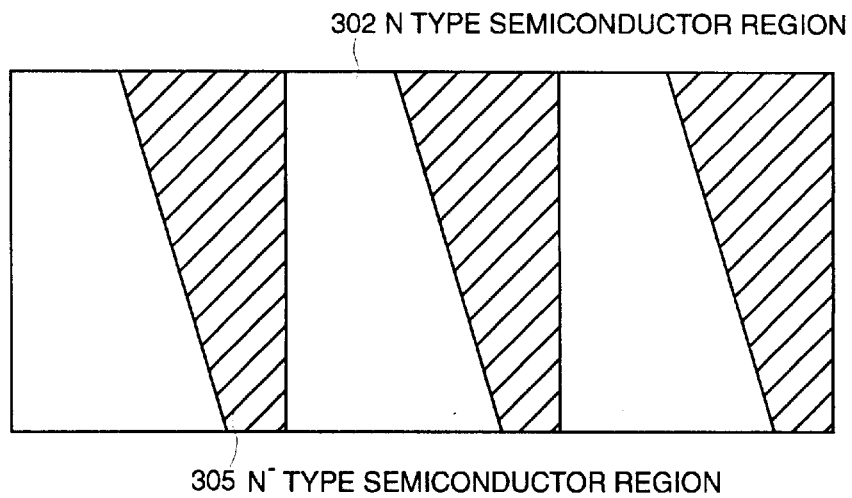
FIG. 7 is a schematic plan view of the intermediate structure in a step of the charge-coupled device producing method according to the third embodiment of the present invention.
Figure 8:
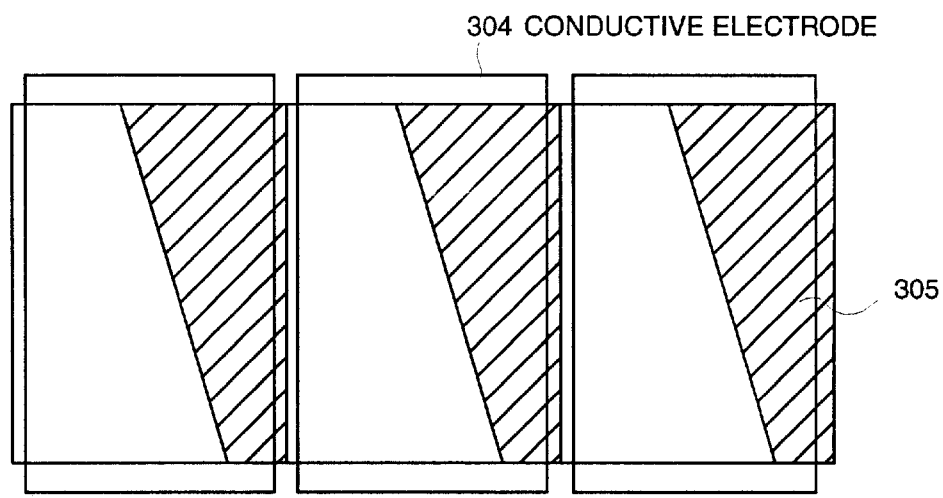
FIG. 8 is a schematic plan view of the intermediate structure in a step of the charge-coupled device producing method according to the third embodiment of the present invention.

FIGS. 7 and 8 are schematic plan views each illustrating the charge-coupled device according to the third embodiment of the present invention. FIG. 7 corresponds to FIG. 2 illustrating the first embodiment. FIG. 8 corresponds to FIG. 3 illustrating the first embodiment.

In the present embodiment, as understood by comparing FIG. 2 with FIG. 7 and FIG. 3 with FIG. 8, the N⁻-type semiconductor region 305 is formed in such a way that the boundary surface between the potential barrier region and the charge storage region has a backslash pattern. Other details are the same as those in the first embodiment. Hence, the detail description will be omitted here. Numeral 302 in FIG. 7 represents an N-type semiconductor region while numeral 302 in FIG. 8 represents an N-type charge transfer electrode.

Fourth Embodiment

FIGS. 9(A), 9(B), 9(C) and 9(D) are flowcharts illustrating the method of producing a charge-coupled device, particularly a charge-coupled device with a buried-channel, single phase drive, single-ply electrode structure, according to the present invention.

Figure 9A:
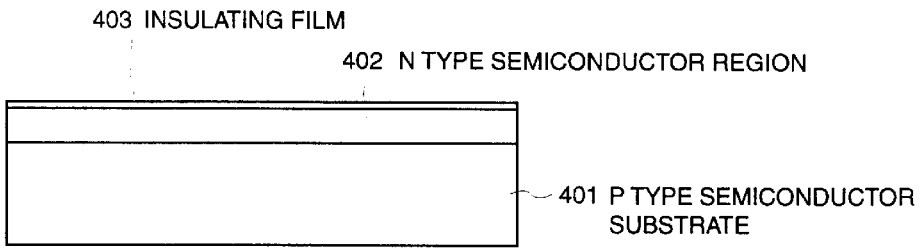
FIGS. 9(A), 9(B), 9(C) and 9(D) are cross sectional views illustrating a charge-coupled device producing method according to the fourth embodiment of the present invention.
Figure 9B:
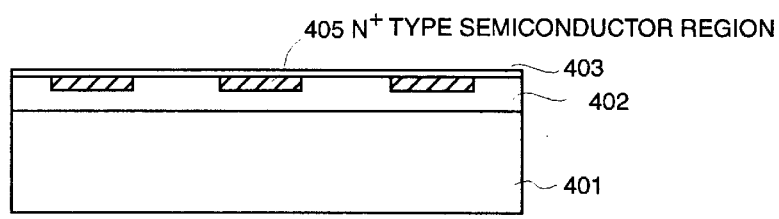
Figure 9C:
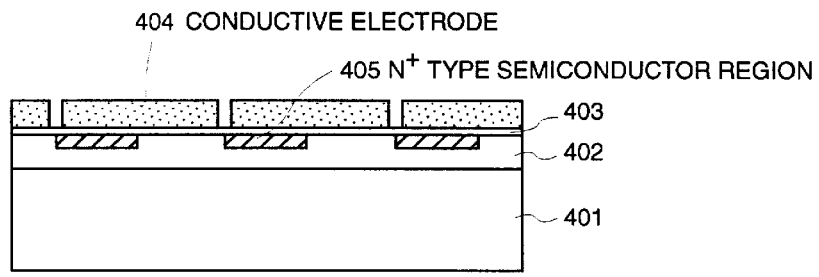
Figure 9D:
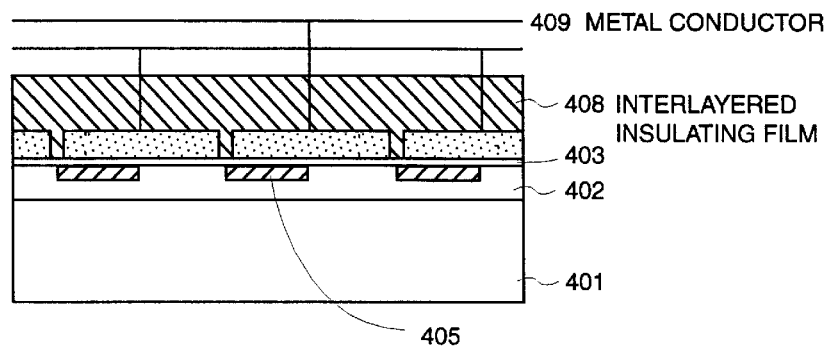
Figure 10:
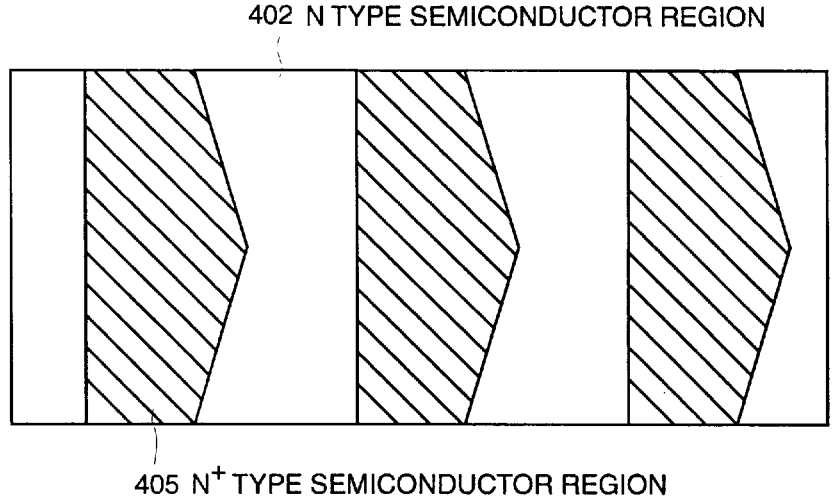
FIG. 10 is a schematic plan view corresponding to the intermediate structure of FIG. 9(B)
Figure 11:
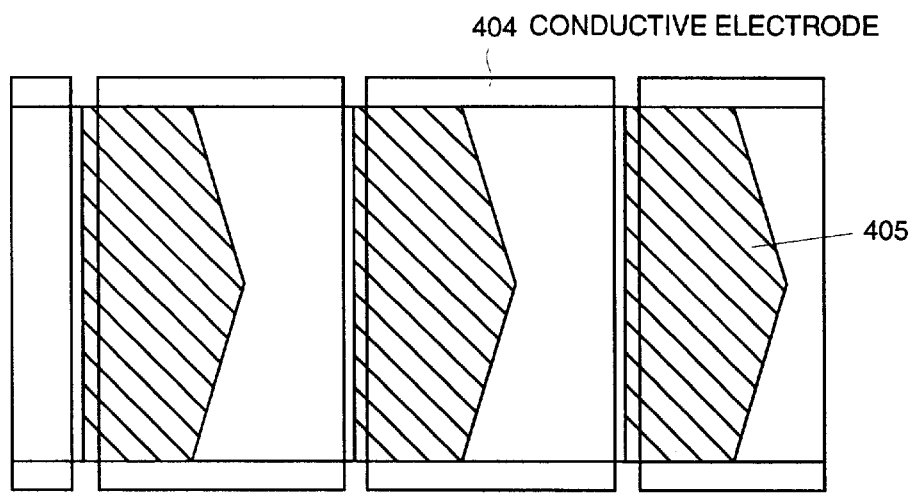
FIG. 11 is a schematic plan view corresponding to the intermediate structure of FIG. 9(C)
Figure 12A:
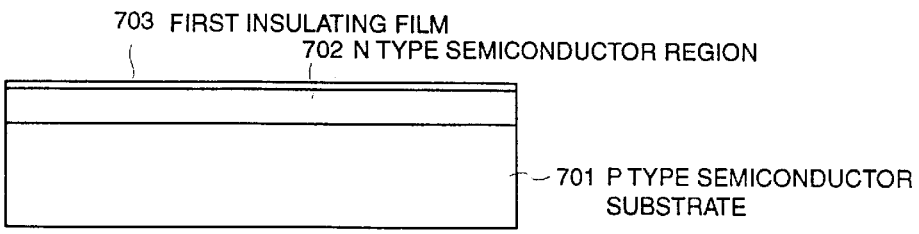
FIGS. 12(A), 12(B), 12(C), 12(D) and 12(E) are cross sectional views illustrating a conventional method of producing a two-phase, two-ply-electrode-type charge-coupled device.
Figure 12B:
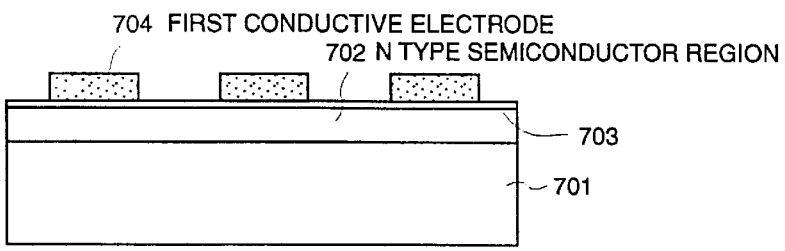
Figure 12C:
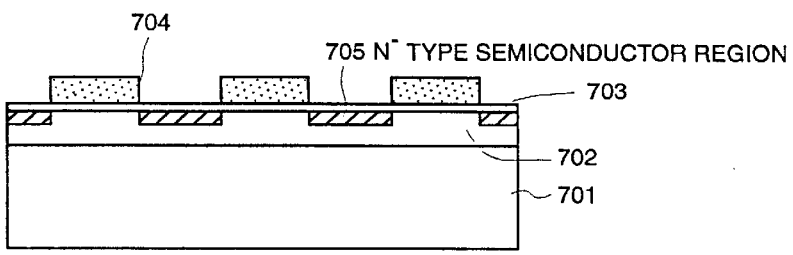
Figure 12D:
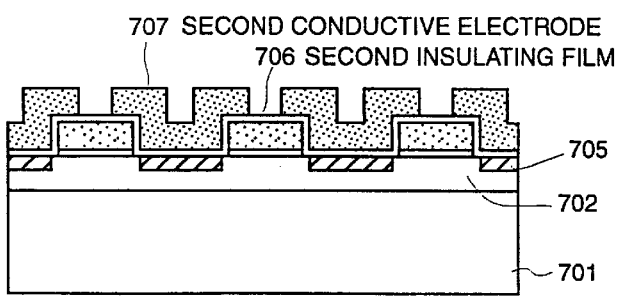
Figure 12E:
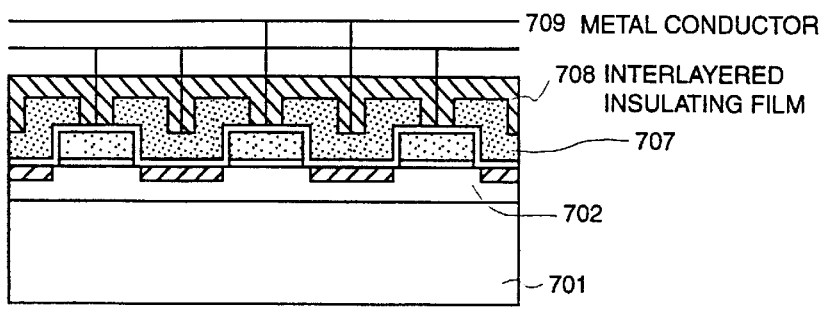
Figure 13:
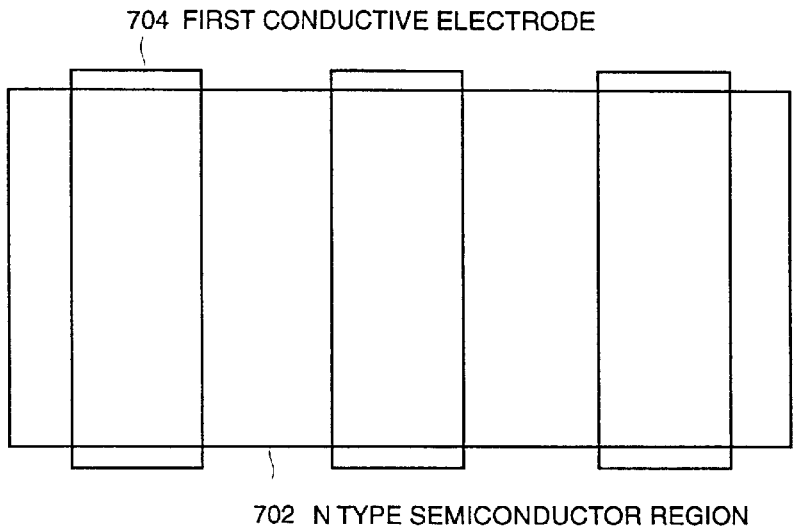
FIG. 13 is a schematic plan view corresponding to the intermediate structure of FIG. 12(B)
Figure 14:
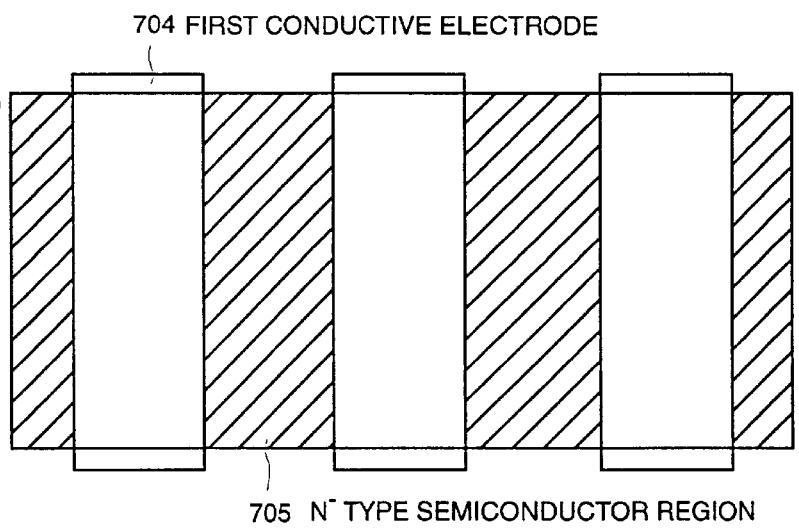
FIG. 14 is a schematic plan view corresponding to the intermediate structure of FIG. 12(C)
Figure 15:
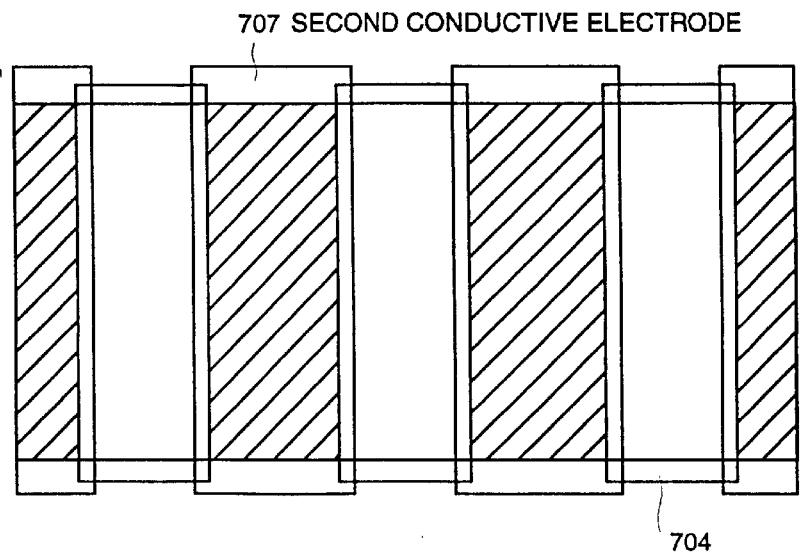
FIG. 15 is a schematic plan view corresponding to the intermediate structure of FIG. 12(D)
Figure 16A:
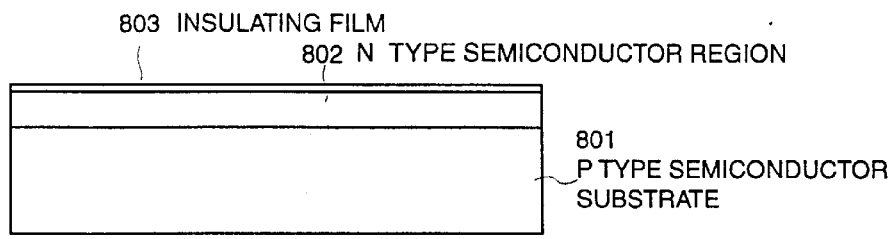
FIGS. 16(A), 16(B), 16(C) and 16(D) are cross sectional views illustrating a conventional method of producing a two-phase, single-ply-electrode-type charge-coupled device.
Figure 16B:
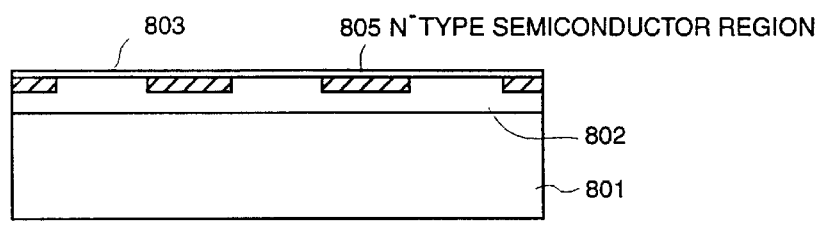
Figure 16C:
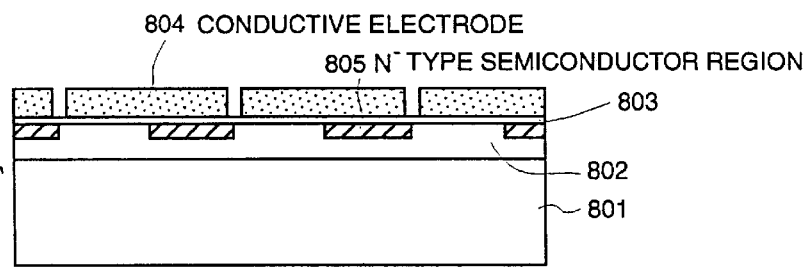
Figure 16D:
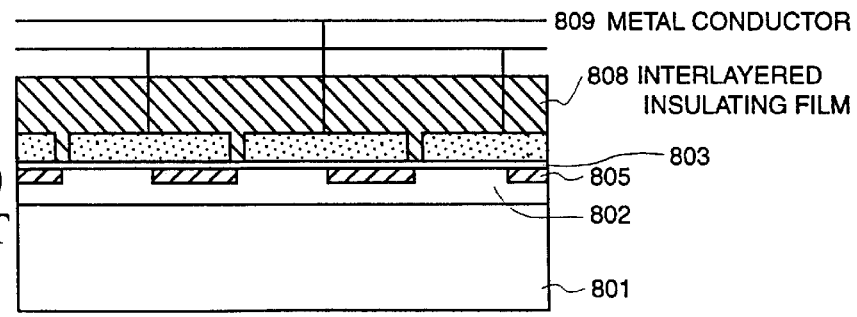
Figure 17:
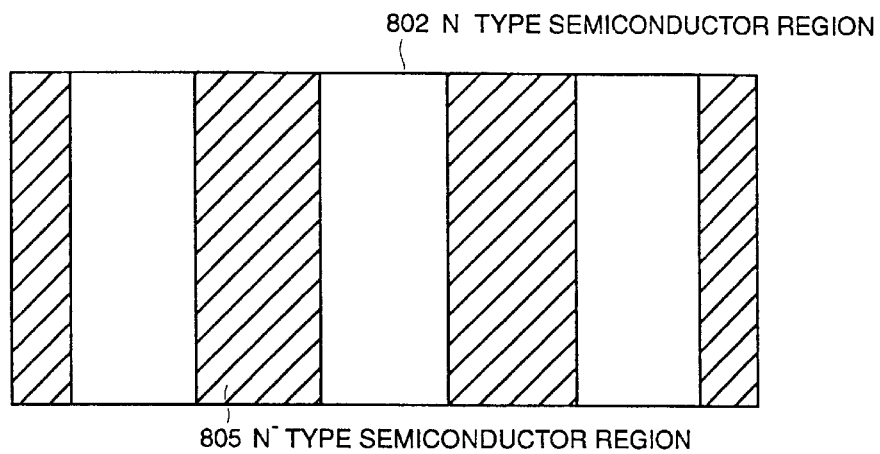
FIG. 17 is a plan view corresponding to the intermediate structure of FIG. 16(B)
Figure 18:
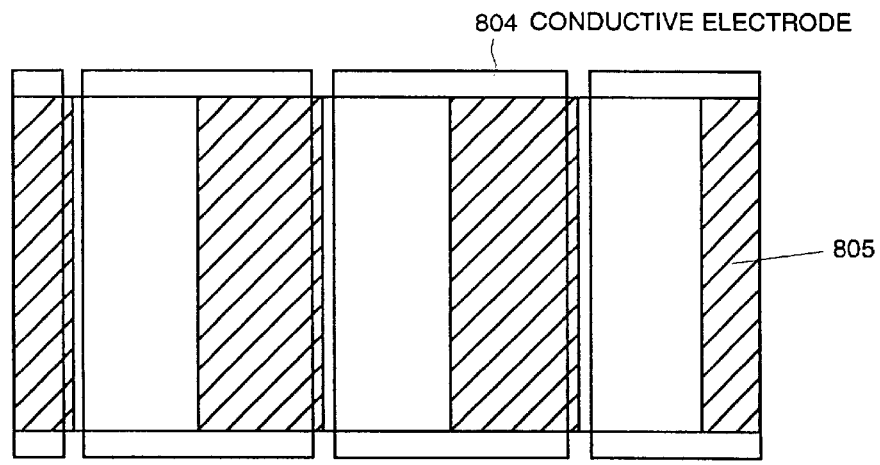
FIG. 18 is a plan view corresponding to the intermediate structure of FIG. 16(C).

FIG. 10 is a schematic plan view corresponding to FIG. 9(B). FIG. 11 is a schematic plan view corresponding to FIG. 9(C).

First, an N-type semiconductor region 402 of a conductivity type opposite to that of a P-type semiconductor substrate 401 is formed on the P-type semiconductor substrate 401. Then, the intermediate structure is subjected to a heating process to form an insulating film (oxide film) 403 on the surface of the N-type semiconductor region 402 (FIG. 9(A)).

Next, impurities (e.g. phosphorus) of the same conductivity type as that of the N-type semiconductor region 402 are implanted with a photoresist in a predetermined pattern acting as a mask. Thus, the N⁺-type semiconductor regions are formed (FIG. 9(B)). The pattern of the mask for the ion implantation differs from that of the conventional mask. The mask has a Σ-shaped pattern (corresponding to the non-shaded portions in FIG. 10). In other words, the impurity implanted region (corresponding to the shaded portion in FIG. 10) has its widened middle portion and its narrowed end portions. That is, the N⁺-type semiconductor region 405 is formed in such a way that the boundary surface between the potential barrier region and the charge storage region has a V-shaped pattern. In the above-mentioned structure, likewise the first embodiment, the potential of the potential barrier region is gradually shallowed due to the narrow channel effect. That is, when a voltage is applied to the charge transfer electrode, the potential P(x) in the charge storage region at the point a distance x in the charge transfer direction from the boundary surface between the potential barrier region and charge storage region is expressed by a monotone decreasing function.

In succession, conductive electrodes 404 of polycrystalline silicon are formed on the insulating film 403 (FIG. 9(C)). Each conductive electrode 404 is patterned so as to overlie a pair of the charge storage region and the potential barrier region.

Next, an interlayered insulating film 408 is formed on the intermediate structure. Electrodes are interconnected with metal conductors 409 (FIG. 9(D)).

Thus, the 2-phase drive type charge-coupled device with a single-ply electrode structure according to the present invention can be provided.

In this embodiment, the potential barrier region (charge storage region) is formed in such a way that the potential in the potential barrier region is gradually shallowed in the charge transfer direction. That is, the sloped potential distribution increases the charge transfer rate under the charge transfer electrode, thus resulting in smooth charge transfer.

The charge storage region in the fourth embodiment has a deep potential, compared with the first to third embodiments. Hence, where the present charge-coupled device is applied to the horizontal CCD of an image sensor, better charge transfer can be accomplished because the transfer electric field between the vertical CCD and the horizontal CCD is strengthened.

The N⁺-type semiconductor region 405 in the fourth embodiment corresponds to the pattern of the N⁻-type semiconductor region 105 in the first embodiment. Hence, the same advantages can be obtained even when the N⁺-type semiconductor region is formed corresponding to the N⁻-type semiconductor region 205 in the second embodiment and the N-type semiconductor region 305 in the third embodiments.

That is, the pattern of the pair of the potential barrier region and the charge storage region underlying the charge transfer electrode (single-ply electrode) is devised, so that a potential gradient can be provided under one charge transfer electrode by utilizing the narrow channel effect. The potential in the charge storage region gradually deepened in the charge transfer direction enables smooth charge transfer.

Preferred embodiments according to the present invention have been described. However, the present invention should not be limited only to the above-mentioned embodiments. Various modifications can be considered without departing from the scope of the present invention. The buried-region type charge-coupled device, for example, has been described in the first to fourth embodiments. However, the present invention can be similarly applied to the surface-type charge-coupled device. Moreover, the present invention can be applied to a charge-coupled device formed in a P-well layer defined in the N-type semiconductor substrate.

The entire disclosure of Japanese Patent Application No. 9-320672 filed on Nov. 21, 1997 including specification, claims, drawing and summary are incorporated herein by reference in its entirety.

What is claimed is:

1. A charge-coupled device comprising:
   a first conductivity-type semiconductor layer;
   a charge transfer electrode formed over said first conductivity-type semiconductor layer; and
   a potential barrier region and a charge storage region formed in said first conductivity-type region underneath said charge transfer electrode, wherein said potential barrier region is formed by implanting impurities of a conductivity type opposite to that of said first conductivity-type semiconductor layer, and
   wherein
   said charge storage region is formed in such a manner that the cross area of said charge storage region at a point a distance x in a charge transfer direction from the boundary between said potential barrier region and said charge storage region is a monotone increasing function when said charge storage region is cut perpendicularly to the charge transfer direction, and the boundary surface between said potential barrier region and said charge storage region has a W-shaped surface.

2. The charge-coupled device defined in claim 1, wherein said first conductivity-type semiconductor layer is formed on a surface of a semiconductor substrate of a conductivity type opposite to that of said first conductivity-type semiconductor layer.

3. The charge-coupled device defined in claim 1, wherein said charge storage region is formed by implanting impurities of the same conductivity type as that of said first conductivity-type semiconductor layer.

4. The charge-coupled device defined in claim 1, wherein said charge storage region is formed in such a manner that the boundary surface between said potential barrier region and said charge storage region has a sloped surface, instead of a vertical surface, in the charge transfer direction.

5. The charge-coupled device defined in claim 1, wherein the boundary surface between said potential barrier region and said charge storage region has a V-shaped surface.

6. The charge-coupled device defined in claim 1, wherein the boundary surface between said potential barrier region and said charge storage region has a slash or backslash surface.

7. A charge-coupled device comprising:

a first conductivity-type semiconductor layer;

a charge transfer electrode formed over said first conductivity-type semiconductor layer; and a potential barrier region and a charge storage region formed in said first conductivity-type semiconductor layer underneath said charge transfer electrode, wherein said potential barrier region is formed by implanting impurities of a conductivity type opposite to that of said first conductivity-type semiconductor layer, said charge storage region is formed in such a manner (a) the boundary surface between said potential barrier region and said charge storage region has a W-shaped sloped surface, instead of a vertical surface, in the charge transfer direction; and (b) that the potential $P(x)$ in said charge storage region at a point a distance x in a charge transfer direction from the boundary between said potential barrier region and said charge storage region is a monotone decreasing function when a voltage is applied to said charge transfer electrode.

8. The charge-coupled device defined in claim 7, wherein said first conductivity-type semiconductor layer is formed on a surface of a semiconductor substrate of a conductivity-type opposite to that of said first conductivity-type semiconductor layer.

9. The charge-coupled device defined in claim 7, wherein said charge storage region is formed by implanting impurities of the same conductivity type as that of said first conductivity-type semiconductor layer.

10. The charge-coupled device defined in claim 7, wherein said charge storage region is formed in such a manner that the cross area of said charge storage region at a point a distance x in a charge transfer direction from the boundary between said potential barrier region and said charge storage region when said charge storage region is cut perpendicularly to the charge transfer direction is a monotone increasing function.

* * * * *